United States Patent
Nozu

(10) Patent No.: US 9,831,389 B2
(45) Date of Patent: Nov. 28, 2017

(54) SEMICONDUCTOR LIGHT-EMITTING ELEMENT AND METHOD OF MANUFACTURING THE SAME

(71) Applicant: Renesas Electronics Corporation, Kawasaki-shi, Kanagawa (JP)

(72) Inventor: Shunsuke Nozu, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 80 days.

(21) Appl. No.: 14/506,056

(22) Filed: Oct. 3, 2014

(65) Prior Publication Data
US 2015/0221829 A1    Aug. 6, 2015

(30) Foreign Application Priority Data
Feb. 6, 2014   (JP) .................................. 2014-021230

(51) Int. Cl.
*H01L 29/22*    (2006.01)
*H01L 33/42*    (2010.01)
*H01L 33/30*    (2010.01)

(52) U.S. Cl.
CPC .............. *H01L 33/42* (2013.01); *H01L 33/30* (2013.01); *H01L 2933/0016* (2013.01)

(58) Field of Classification Search
CPC ................................ H01L 33/40; H01L 33/42
USPC ......................................... 257/99, 101, 102
See application file for complete search history.

(56) References Cited

U.S. PATENT DOCUMENTS

| | | | | |
|---|---|---|---|---|
| 4,888,062 A * | 12/1989 | Nakagawa | .......... | H01L 31/0296 136/258 |
| 2003/0059972 A1* | 3/2003 | Ikeda | ...................... | H01L 33/14 438/47 |
| 2004/0135166 A1* | 7/2004 | Yamada | .............. | H01L 33/0079 257/103 |
| 2012/0061642 A1* | 3/2012 | Tanaka | .................... | H01L 33/42 257/13 |
| 2012/0213670 A1* | 8/2012 | Melpignano | ...... | B01L 3/502715 422/69 |
| 2014/0070227 A1* | 3/2014 | Totani | .................... | H01L 33/32 257/76 |

FOREIGN PATENT DOCUMENTS

JP        2008-10546 A        1/2008

* cited by examiner

*Primary Examiner* — Matthew E Warren
(74) *Attorney, Agent, or Firm* — Sughrue Mion, PLLC

(57) ABSTRACT

A transparent electrode is made of a first transparent electrode and a second transparent electrode containing a metal atom whose concentration is 10 wt % or less. The first transparent electrode is provided in a region which is overlapped with a p-side pad electrode when seen in a plane view, and the second transparent electrode is provided in a region except for the region which is overlapped with the p-side pad electrode when seen in the plane view. an electric current injected from the p-side pad electrode is diffused into the second transparent electrode, and is injected efficiently into an active layer in a region except for the region which is overlapped with the p-side pad electrode when seen in the plane view. Therefore, the luminous efficiency increases. Also, a contact resistance between the second transparent electrode and the p-type contact layer is low, the element resistance decreases.

3 Claims, 8 Drawing Sheets

SEMICONDUCTOR LIGHT-EMITTING ELEMENT AND METHOD OF MANUFACTURING THE SAME

CROSS-REFERENCE TO RELATED APPLICATION

The present application claims priority from Japanese Patent Application No. 2014-021230 filed on Feb. 6, 2014, the content of which is hereby incorporated by reference into this application.

TECHNICAL FIELD OF THE INVENTION

The present invention relates to a semiconductor light-emitting element and a technique of manufacturing the same. The present invention can be used suitably for a semiconductor light-emitting element having, for example, a transparent electrode and for manufacturing the same.

BACKGROUND

For example, Japanese Patent Application Laid-open Publication No. 2008-10546 (Patent Document 1) describes a semiconductor light-emitting element obtained by sequentially stacking a semiconductor substrate, a light emitting layer formation part, a window layer forming a light extraction surface, a first light transmitting layer, and a second light transmitting layer having conductivity. In this semiconductor light-emitting element, the first light transmitting layer functions as a diffusion prevention film which inhibits a constituent atom of the second light transmitting layer from diffusing onto the window layer side.

SUMMARY

As a light source for photo coupler, a semiconductor light-emitting element having a transparent electrode is used. This semiconductor light-emitting element has such a structure that a semiconductor layer and a transparent electrode are sequentially stacked on a first surface of an n-type substrate, and is provided with a p-side pad electrode electrically connected with a part of the transparent electrode on the transparent electrode and an n-side electrode electrically connected with a second surface opposite to the first surface of the n-type substrate. The above-described semiconductor layer is formed of, for example, an n-type clad layer, an active layer, a p-type clad layer and a p-type contact layer which are stacked sequentially from the n-type substrate side. However, light emitted in a semiconductor layer immediately below the p-side pad electrode is blocked by the p-side pad electrode, and cannot be extracted sufficiently to the outside of the semiconductor light-emitting element, and therefore, there is a problem that a high luminous efficiency can not be acquired.

Other problems and novel characteristics will be apparent from the description of the present specification and the accompanying drawings.

A semiconductor light-emitting element according to one embodiment includes: a substrate; a semiconductor layer formed on a first surface of the substrate; a first transparent electrode formed on a first region of the semiconductor layer; a second transparent electrode formed on a second region except for the first region of the semiconductor layer; a first electrode which is formed on the first transparent electrode and is electrically connected with a part of the first transparent electrode; and a second electrode formed on a second surface of the substrate. The second transparent electrode contains a metal atom whose concentration is 10 wt % or less, and a contact resistance between the second transparent electrode and the semiconductor layer is $1 \times 10^{-4}$ $\Omega \cdot cm^2$ or less.

According to one embodiment, a semiconductor light-emitting element which is high in a luminous efficiency and low in an element resistance can be provided.

BRIEF DESCRIPTIONS OF THE DRAWINGS

DETAILED DESCRIPTION

Figure 1:
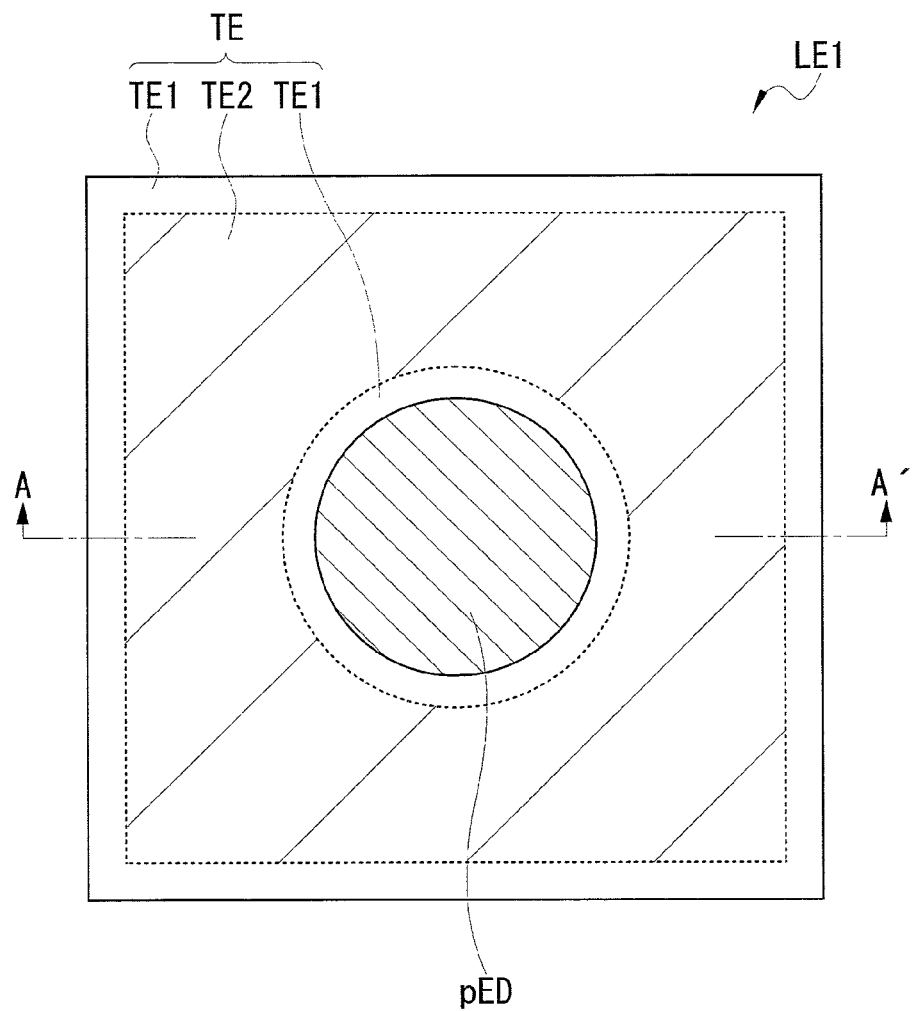
FIG. 1 is a plane view of a principal part of a semiconductor light-emitting element according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Further, when "formed of A", "formed by A", "having A", and "including A" are described, it goes without saying that other components are not eliminated unless otherwise specified to be only the component. Similarly, in the embodiments described below, when referring to the shape of the components, positional relation thereof, and the like, the substantially approximate and similar shapes and the like are included therein unless otherwise stated or except the case where it is conceivable that they are apparently excluded in principle. The same goes for the numerical value and the range described above.

Also, in some drawings used in the embodiments, hatching is used even in a plan view so as to make the drawings easy to see. Also, components having the same function are denoted by the same reference symbols in principle throughout all drawings for describing the embodiments described below, and the repetitive description thereof is omitted. Hereinafter, the embodiments will be described in detail based on the drawings.

(Detailed Description of Problem)

The above-described Patent Document 1 describes a semiconductor light-emitting element which has a transparent electrode (corresponds to a first light transmitting layer and a second light transmitting layer in the Patent Document 1). In this semiconductor light-emitting element, a plurality of through-holes which penetrate through the first light transmitting layer and the second light transmitting layer are provided. And, a plurality of island-formed contact electrodes which makes an ohmic contact with respect to a window layer through the plurality of through-holes are formed in the first light transmitting layer and second light transmitting layer except for a region immediately below a pad electrode. An electric current injected from the pad electrode passes through the first light transmitting layer, the second light transmitting layer, and the plurality of contact electrodes, and is injected into the window layer and an active layer which is a lower layer of the window layer.

Incidentally, the semiconductor light-emitting element which has the transparent electrode generally has problems to be solved which are described below.

(1) An element resistance is high since a contact resistance between the transparent electrode and the semiconductor layer is high.

(2) Light emitted in the active layer immediately below the pad electrode has a low luminous efficiency since the light is blocked by the pad electrode and does not contribute to external light emission.

For the above-described problem (1) in the Patent Document 1, a low contact resistance is acquired by making a contact between the plurality of contact electrodes and the window layer. In addition, for the above-described problem (2) in the Patent Document 1, decrease in the luminous efficiency is prevented by injecting the electric current by using the plurality of contact electrodes into the first light transmitting layer and the second light transmitting layer except for the region immediately below the pad electrode so as to be distributed therein. However, since the plurality of contact electrodes block the light emitted in the active layer, alight extraction efficiency decreases, and a high luminous efficiency is not acquired.

First Embodiment

Semiconductor Light-Emitting Element

Figure 2:
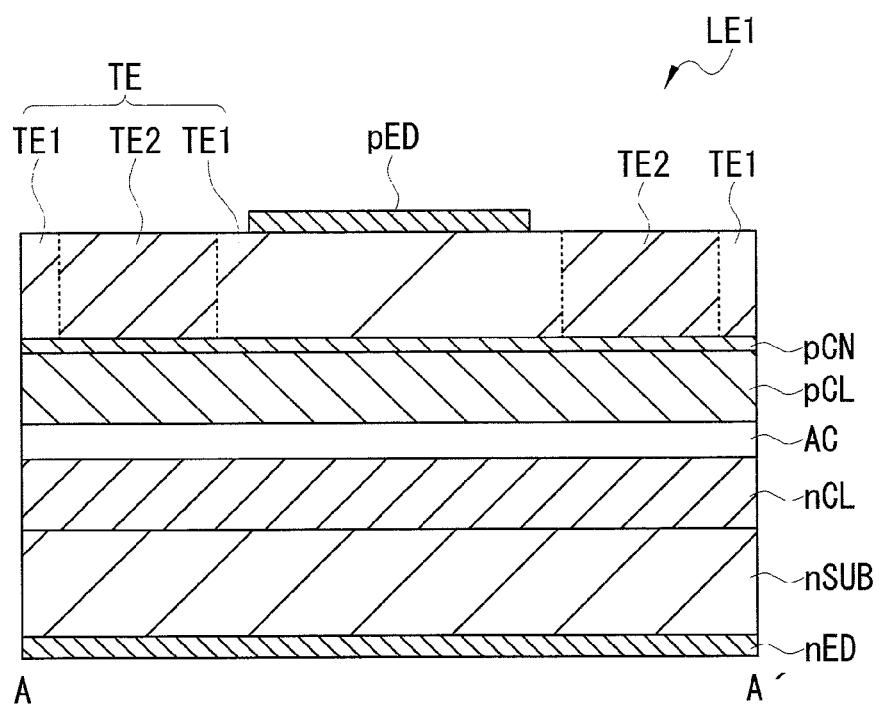
FIG. 2 is a cross-sectional view of a principal part of the semiconductor light-emitting element according to the first embodiment (a cross-sectional view of a principal part of the semiconductor light-emitting element along a line A-A' of FIG. 1)

A structure of a semiconductor light-emitting element according to a first embodiment will be described by using FIGS. 1 and 2. FIG. 1 is a plane view of a principal part of the semiconductor light-emitting element. FIG. 2 is a cross-sectional view of a principal part of the semiconductor light-emitting element (a cross-sectional view of a principal part of the semiconductor light-emitting element along a line A-A' of FIG. 1).

As illustrated in FIGS. 1 and 2, a semiconductor light-emitting element LE1 has such a structure that an n-type clad layer nCL, an active layer (light emitting layer) AC, a p-type clad layer pCL, a p-type contact layer pCN and a transparent electrode TE are sequentially stacked on a first surface (a front surface, main surface) of an n-type substrate nSUB.

Furthermore, on the transparent electrode TE, a p-side pad electrode (a p-side electrode, pad electrode, first electrode) pED which is electrically connected with a part of the transparent electrode TE is formed, and an n-side electrode (second electrode) nED which is electrically connected with the whole surface of a second surface (a rear surface) opposite to the first surface of the n-type substrate nSUB is formed. The p-side pad electrode pED is arranged in a center part of the semiconductor light-emitting element LE1 when seen in a plane view, and a shape of the p-side pad electrode pED when seen in a plane view (hereinafter, referred to as a plane shape thereof) is a single circle.

The n-type substrate nSUB is made of, for example, GaAs (gallium arsenide), and the n-type clad layer nCL is made of, for example, AlGaAs (aluminum gallium arsenide) to which Si (silicon) is added. The active layer AC is made of, for example, AlGaAs. The p-type clad layer pCL is made of, for example, AlGaAs. The p-type contact layer pCN is made of, for example, GaAs to which C (carbon) is added.

In the semiconductor light-emitting element LE1, an electric current injected from the p-side pad electrode pED is diffused by the transparent electrode TE, and is injected into the p-type contact layer pCN, the p-type clad layer pCL and the active layer AC, and the light emitted on a junction surface between the p-type clad layer pCL and the active layer AC is extracted from the p-side pad electrode pED side.

In the semiconductor light-emitting element LE1 according to the first embodiment, a configuration of the transparent electrode TE is a main feature, and details of the configuration, effects thereof, and others will be defined by the following descriptions.

The transparent electrode TE is formed of, for example, an indium tin oxide (hereinafter, referred to as ITO) film, and a thickness of the film is, for example, about 0.1 μm to 10 μm. And, this transparent electrode TE is formed of the first transparent electrode TE1 formed in the first region and the second transparent electrode TE2 formed in the second region except for the first region.

Inside the second transparent electrode TE2, a metal atom such as Ti (titanium) having a concentration of 10 wt % or less is diffused. The second transparent electrode TE2 contains Ti, so that a contact resistance between the second transparent electrode TE2 and the p-type contact layer pCN is lower than a contact resistance between the first transparent electrode TE1 and the p-type contact layer pCN. A contact resistance between the first transparent electrode TE1 and the p-type contact layer pCN is in a range of, for example, $1\times10^{-2}$ $\Omega\cdot cm^2$ to $5\times10^{-2}$ $\Omega\cdot cm^2$. On the other hand, a contact resistance between the second transparent electrode TE2 and the p-type contact layer pCN is, for example, $1\times10^{-4}$ $\Omega\cdot cm^2$ or less.

In the semiconductor light-emitting element LE1, the first transparent electrode TE1 is formed in a region which is overlapped with the p-side pad electrode pED when seen in a plane view, and the second transparent electrode TE2 is formed in a region except for the region which is overlapped with the p-side pad electrode pED when seen in a plane view. More specifically, the second transparent electrode TE2 which continuously surrounds a periphery of the p-side pad electrode pED is formed from a position with a predetermined distance outward from a circumferential edge of the p-side pad electrode pED to a circumferential edge of the semiconductor light-emitting element LE1 when seen in a plane view.

In other words, when seen in a plane view, the second transparent electrode TE2 has a shape surrounded by a quadrangle outer shape (external contour) and a circular inner shape (internal contour), a circle forming the inner shape is smaller than a quadrangle forming the outer shape, and the p-side pad electrode pED is included in the circle forming the inner shape when seen in a plane view. In addition, the p-side pad electrode pED is not overlapped with the second transparent electrode TE2 when seen in a plane view, and the p-side pad electrode pED is arranged in a closed region surrounded by the second transparent electrode TE2.

Note that FIGS. 1 and 2 exemplify a structure of the semiconductor light-emitting element LE1 not having the second transparent electrode TE2 formed in the circumferential edge part of the semiconductor light-emitting element LE1. However, the second transparent electrode TE2 may be formed in the circumferential edge part of the semiconductor light-emitting element LE1.

Since the contact resistance between the second transparent electrode TE2 and the p-type contact layer pCN is lower than the contact resistance between the first transparent electrode TE1 and the p-type contact layer pCN by about a two-digit number or more, the electric current injected from the p-side pad electrode pED is diffused in the second transparent electrode TE2, and is injected into the p-type contact layer pCN. That is, the electric current injected from the p-side pad electrode pED is efficiently injected into the active layer AC in a region except for the region overlapped with the p-side pad electrode pED when seen in a plane view. As a result, the light emitted on the junction surface between the p-type clad layer pCL and the active layer AC can be extracted efficiently, so that the high luminous efficiency is acquired.

In addition, since the contact resistance between the second transparent electrode TE2 and the p-type contact layer pCN is a low value of, for example, $1\times10^{-4}$ $\Omega\cdot cm^2$ or less, an element resistance can be decreased.

In addition, since the concentration of Ti diffused in the second transparent electrode TE2 is 10 wt % or less, a transmittance of the second transparent electrode TE2 does not decrease remarkably, and a transmittance of, for example, 95% or higher is acquired. Therefore, the Ti diffused in the second transparent electrode TE2 does not affect the luminous efficiency.

The above-described FIGS. 1 and 2 illustrate the second transparent electrode TE2 which continuously surrounds the periphery of the p-side pad electrode pED from the position with the predetermined distance outward from the circumferential edge of the p-side pad electrode pED to the circumferential edge of the semiconductor light-emitting element LE1 when seen in a plane view. However, the second transparent electrode TE2 which continuously surrounds the periphery of the p-side pad electrode pED may be formed from a position which is overlapped with the circumferential edge of the p-side pad electrode pED to the circumferential edge of the semiconductor light-emitting element LE1 when seen in the plane view.

However, when the p-side pad electrode pED and the second transparent electrode TE2 are overlapped with each other when seen in a plane view, the light emitted on the junction surface between the p-type clad layer pCL and the active layer AC in a region where they are overlapped with each other is blocked by the p-side pad electrode pED, and therefore, does not contribute to the external light emission. Therefore, when seen in the plane view, it is desired that the p-side pad electrode pED and the second transparent electrode TE2 are not overlapped with each other.

<<Method of Manufacturing Semiconductor Light-Emitting Element>>

A method of manufacturing the semiconductor light-emitting element according to the first embodiment will be described in order of processes by using FIGS. 3 to 6. FIGS. 3 to 6 are cross-sectional views of a principal part of the semiconductor light-emitting element in a manufacturing process.

Figure 3:
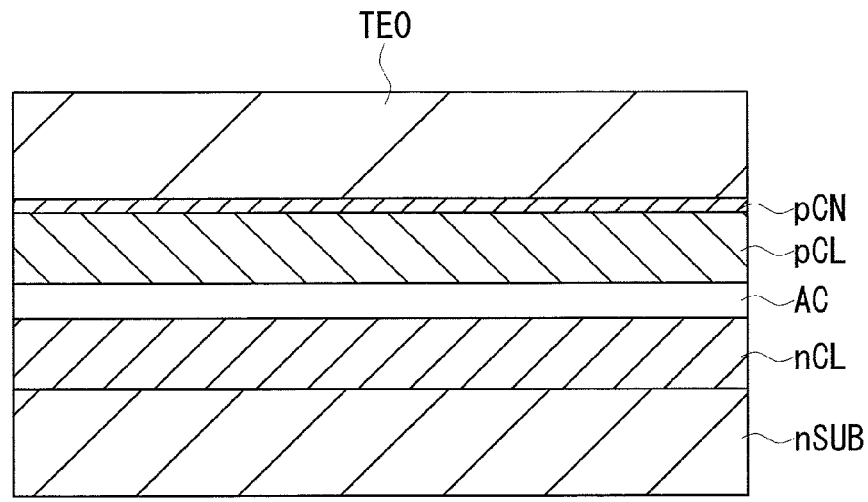
FIG. 3 is a cross-sectional view of a principal part of the semiconductor light-emitting element in a manufacturing process according to the first embodiment.

First, as illustrated in FIG. 3, an n-type substrate nSUB which has the first surface and the second surface opposite to the first surface is prepared. The n-type substrate nSUB at this stage is a semiconductor thin plate having a planar and substantially circle shape referred to as a wafer, and is, for example, a GaAs substrate having a Si concentration of about $1\times10^{18}$ $cm^{-3}$.

Next, on the first surface of the n-type substrate nSUB, the n-type clad layer nCL, the active layer AC, the p-type clad layer pCL and the p-type contact layer pCN are sequentially stacked. Each of the n-type clad layer nCL, the active layer AC, the p-type clad layer pCL and the p-type contact layer pCN is formed by, for example, a crystal growth method using a metal organic chemical vapor deposition method (hereinafter, referred to as a MO CVD method).

The n-type clad layer nCL is made of, for example, AlGaAs to which Si is added. A concentration of the Si added to this AlGaAs is, for example, about $1\times10^{18}$ $cm^{-3}$, and a thickness of the n-type clad layer nCL is, for example, about 0.6 μm. The active layer AC is made of, for example, AlGaAs, and its thickness is, for example, about 0.3 μm. The p-type clad layer pCL is made of, for example, AlGaAs, and its thickness is, for example, about 0.6 μm. The P-type contact layer pCN is made of, for example, GaAs to which C is added. A concentration of the C added to this GaAs is, for example, about $5\times10^{18}$ $cm^{-3}$, and a thickness of the p-type contact layer pCN is, for example, about 0.03 μm.

Here, a composition of the active layer AC is appropriately determined so that a light wavelength is in a predetermined wavelength band of red, orange, yellow, yellowish green, green, or others. In addition, each composition of the n-type clad layer nCL and the p-type clad layer pCL is determined so that each band gap of the n-type clad layer nCL and the p-type clad layer pCL is wider than a band gap of the active layer AC.

As a raw material used in the MOCVD method, an organic metal such as TMG ($C_3H_9Ga$; Trimethyl gallium), TMA ($C_3H_9Al$; Trimethyl aluminium) or TMI ($C_3H_9In$; Trimethyl indium) or hydride gas such as $AsH_3$ (Arsine) is cited. For example, $SiH_4$ (Silane) is used as a raw material of the Si, and, for example, $CBr_4$ (carbon tetrabromide) is used as a raw material of the C. In addition, a temperature of the crystal growth in the MOCVD method is, for example, about 700° C. to 750° C.

Next, a transparent electrode TE0 is formed on the p-type contact layer pCN. As the transparent electrode TE0, an ITO film can mainly be exemplified. The ITO film is formed by, for example, a sputtering method, an evaporation method, a plasma-CVD (Chemical Vapor Deposition) method or a sol-gel method. When the ITO film is formed by the sputtering method, it is desired that a film forming temperature is, for example, about 350° C. to 450° C., and a deposition thickness is, for example, about 0.1 μm to 10 μm in order to acquire the ITO film which is high in a transmittance and low in a resistance (for example, about $10^{-4}$ Ω·cm).

A contact resistance between the transparent electrode TE0 and the p-type contact layer pCN is in a range of, for example, $1 \times 10^{-2}$ Ω·cm² to $5 \times 10^{-2}$ Ω·cm².

Figure 4:
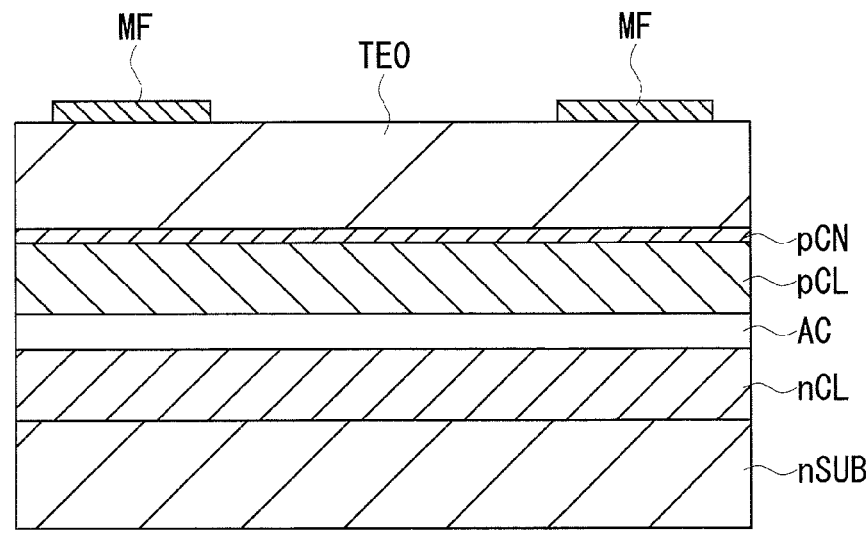
FIG. 4 is a cross-sectional view of a principal part of the semiconductor light-emitting element of the same part as FIG. 3 in a manufacturing process, as continued from FIG. 3.

Next, as illustrated in FIG. 4, a metal film MF which is in contact with the transparent electrode TE0 is formed in a region where the second transparent electrode TE2 is to be formed in a later process. Here, the metal film MF is formed so as to surround a region where the p-side pad electrode pED is to be formed in a later process. The metal film MF is a Ti film or a metal multilayer film containing Ti in a lower layer. This metal multilayer film is, for example, a metal multilayer film (Ti/Au film) containing Ti in a lower layer and Au (gold) in an upper layer, a metal multilayer film (Ti/Al film) containing Ti in a lower layer and Al (aluminum) in an upper layer, or others, and the metal layer (for example, Au and Al) forming the upper layer of the metal multilayer film has a function of preventing surface oxidation. The metal film MF becomes a diffusion source of the Ti as described later, and therefore, each thickness of the Ti film and the Ti layer forming the lower layer of the metal multilayer film is, for example, desirably about 1 nm to 100 nm.

The metal film MF can be formed by, for example, the following manufacturing processes. First, on the transparent electrode TE0, a resist pattern is formed by a lithography method. This resist pattern is formed on the transparent electrode TE0 in a region except for a region where the second transparent electrode TE2 is to be formed in a later process. Subsequently, on the transparent electrode TE0, the Ti film or the metal multilayer film containing Ti in the lower layer is deposited by a vacuum deposition method or the sputtering method. Subsequently, by removing the above-described resist pattern, the Ti film or the metal multilayer film containing Ti in the lower layer in the region except for the region where the second transparent electrode TE2 is to be formed in the later process is removed. In this manner, the metal film MF made of the Ti film or the metal multilayer film containing Ti in the lower layer is formed on the transparent electrode TE0 in the region where the second transparent electrode TE2 is to be formed in the later process.

Figure 5:
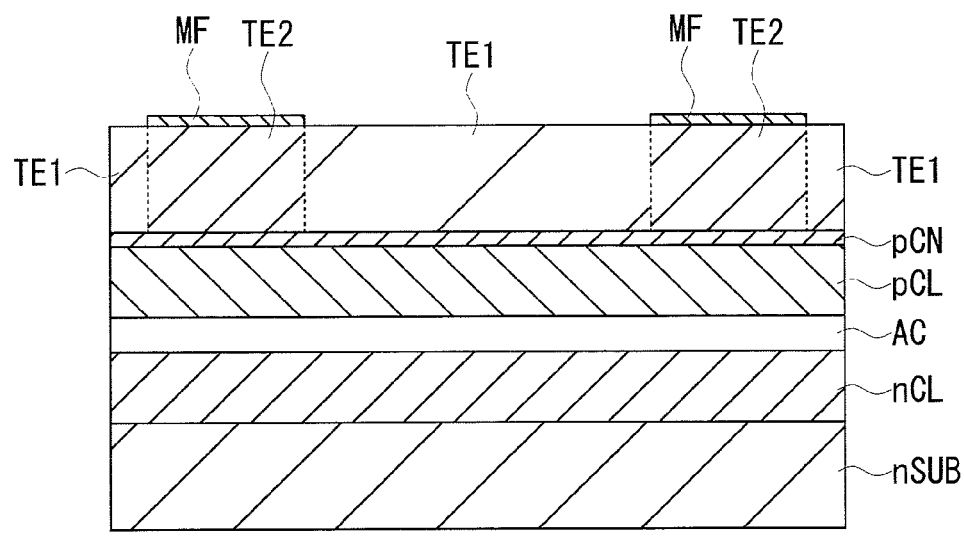
FIG. 5 is a cross-sectional view of a principal part of the semiconductor light-emitting element of the same part as FIG. 3 in a manufacturing process, as continued from FIG. 4.

Next, as illustrated in FIG. 5, heat treatment is performed under a nitrogen atmosphere, and some of Ti forming the metal film MF are diffused in the transparent electrode TE0 in a region from the junction surface between the metal film MF and the transparent electrode TE0 to the junction surface between the transparent electrode TE0 and the p-type contact layer pCN, so that the second transparent electrode TE2 containing Ti is formed. A temperature of the above-described heat treatment is, for example, about 500° C. to 600° C., and a period of time for the heat treatment is, for example, about 20 minutes.

While a contact resistance between the second transparent electrode TE2 and the p-type contact layer pCN decreases as the concentration of the Ti contained in the second transparent electrode TE2 increases, a transmittance of the second transparent electrode TE2 decreases at the same time. Accordingly, in the first embodiment, the concentration of the Ti contained in the second transparent electrode TE2 is set so that the contact resistance between the second transparent electrode TE2 and the p-type contact layer pCN is $1 \times 10^{-4}$ Ω·cm² or less, and so that the transmittance of the second transparent electrode TE2 is 95% or higher. As a concentration of the Ti contained in the second transparent electrode TE2 which satisfies the above-described conditions, for example, 1 wt % to 10 wt % is considered to be a suitable range, and furthermore, 1 wt % to 3 wt % is considered to be the most suitable range.

In addition, a distribution of the concentration of the Ti contained in the second transparent electrode TE2 may be uniform or not uniform in a plane direction and a perpendicular direction as long as the contact resistance between the second transparent electrode TE2 and the p-type contact layer pCN is $1 \times 10^{-4}$ Ω·cm² or less and the transmittance of the second transparent electrode TE2 is 95% or higher.

Next, the metal film MF which is left on the second transparent electrode TE2 is removed by, for example, a wet etching method. When the metal film MF is left on the second transparent electrode TE2, the metal film MF inhibits the light extraction, and therefore, it is desired to remove the metal film MF. However, if a thickness of the metal film MF which is left on the second transparent electrode TE2 is, for example, 2 nm or less, the metal film MF does not affect the light extraction, and therefore, the metal film MF may be not removed on the second transparent electrode TE2 but left thereon.

In this manner, the first transparent electrode TE1 made of the transparent electrode TE0 which does not contain the Ti, and the second transparent electrode TE2 made of the transparent electrode TE0 containing the Ti are formed on the p-type contact layer pCN.

Figure 6:
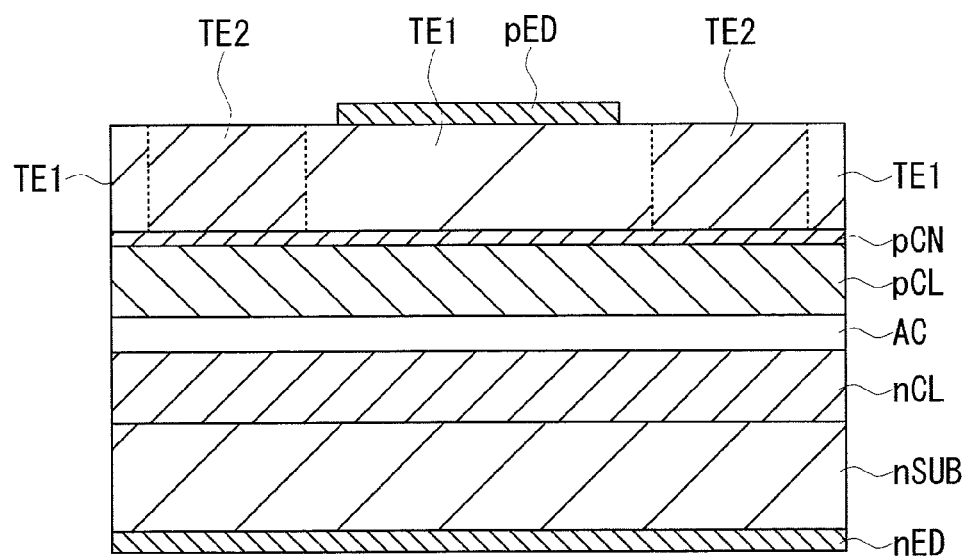
FIG. 6 is a cross-sectional view of a principal part of the semiconductor light-emitting element of the same part as FIG. 3 in a manufacturing process, as continued from FIG. 5.

Next, as illustrated in FIG. 6, the p-side pad electrode pED electrically connected with the first transparent electrode TE1, and the n-side electrode nED electrically connected with the n-type substrate nSUB are formed.

The p-side pad electrode pED is formed of, for example, a metal multilayer film (Ti/Al film) obtained by stacking Ti and Al sequentially in order from the bottom, a metal multilayer film (Ti/Au film) obtained by stacking Ti and Au sequentially in order from the bottom, a metal multilayer film (Ti/Pt/Au film) obtained by stacking Ti, Pt (platinum) and Au sequentially in order from the bottom, or others. The p-side pad electrode pED is formed by depositing such a metal multilayer film on the first transparent electrode TE1 by, for example, the vacuum deposition method or sputtering method using a mask.

A plane shape of the p-side pad electrode pED is a single circle (see the above-described FIG. 1). In addition, a diameter of the p-side pad electrode pED is desirably 100 μm or more for stable bonding between the p-side pad electrode pED and a conductive member connected with the p-side pad electrode pED. Meanwhile, the light emitted in the active layer AC immediately below the p-side pad electrode pED is blocked by the p-side pad electrode pED and does not contribute to the external light emission, and therefore, a diameter of the p-side pad electrode pED is desirably 150 μm or less.

The n-side electrode nED is, for example, a metal multilayer film (AuGe/Ni/Au film) or others obtained by stacking AuGe (gold germanium), Ni (nickel) and Au sequentially from the second surface side of the n-type substrate nSUB. The n-side electrode nED is formed by depositing such a metal multilayer film on the whole second surface of the n-type substrate nSUB by, for example, the vacuum deposition method or the sputtering method.

Next, the n-type substrate nSUB is divided into a plurality of chips so as to form an individual semiconductor light-emitting element LE1. The n-type substrate nSUB is divided by using, for example, a dicing method or a scribe braking method. A plane shape of the chip is made of a quadrangle, and a size of one side of the quadrangle is, for example, 200 μm to 400 μm.

Although the semiconductor light-emitting element LE1 using an AlGaAs-based compound semiconductor material is exemplified in the first embodiment, the semiconductor light-emitting element is not limited to this. For example, an AlGaInAs (aluminum gallium indium arsenide)-based, an AlGaInP (aluminum gallium indium phosphorus)-based, an AlGaInPAs (aluminum gallium indium phosphorus arsenic)-based, and an AlGaInN (aluminum gallium indium nitrogen)-based compound semiconductor material or others may be used. Also in semiconductor light-emitting elements using these compound semiconductor materials, the same effect as that of the semiconductor light-emitting element LE1 using the AlGaAs-based compound semiconductor material can be acquired.

In addition, although the ITO film has been used for the transparent electrode TE in the first embodiment, the material is not limited to this. For example, a conductive material having a translucency such as tin oxide or nickel oxide may be used in place of the ITO film.

In addition, although Ti has been used as the metal atom which is diffused in the second transparent electrode TE2 in the first embodiment, the metal atom is not limited to this. For example, Au or Al may be used.

In addition, in the first embodiment, in order to acquire the high luminous efficiency, the second transparent electrode TE2 has been formed so that the p-side pad electrode pED and the second transparent electrode TE2 are not be overlapped with each other when seen in a plane view. However, in consideration of an alignment shift or others in the manufacturing process, an aspect of partial overlap of the second transparent electrode TE2 with the p-side pad electrode pED when seen in a plane view is not excluded.

In addition, although the second transparent electrode TE2 is formed so as to surround almost the whole region except for the region where the p-side pad electrode pED when seen in a plane view is formed in the first embodiment, the formation is not limited to this.

Other shapes of the second transparent electrode TE2 when seen in a plane view will be described by using FIGS. 7A to 7D. Each of FIGS. 7A, 7B, 7C and 7D is a plane view of a principal part describing a shape of the second transparent electrode TE2 when seen in a plane view.

Figure 7A:
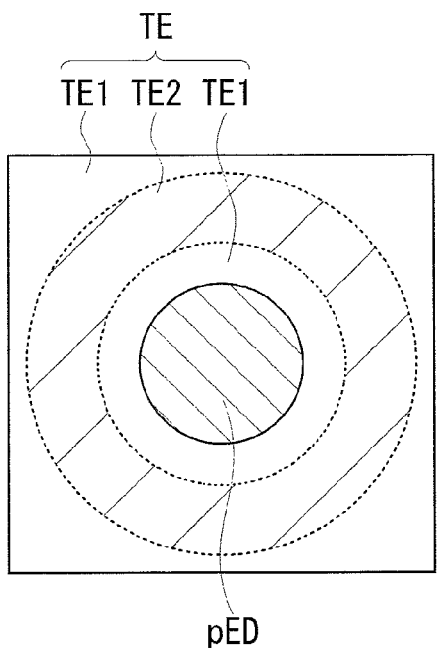
FIG. 7A is a plane view of a principal part describing a shape of a second transparent electrode when seen in a plane view.

As illustrated in FIG. 7A, the shape of the second transparent electrode TE2 when seen in the plane view may be an annular shape having a predetermined width which surrounds continuously a periphery of the p-side pad electrode pED. For example, the shape of the second transparent electrode TE2 when seen in the plane view can be an annular shape obtained by excluding a second circle which has a second diameter smaller than a first diameter and whose center is the same as a center of a first circle from the first circle having the first diameter. The p-side pad electrode pED is arranged inside the second circle when seen in the plane view.

In other words, the second transparent electrode TE2 has an annular shape (loop shape) surrounded by a circular outer shape (external contour) and a circular inner shape (internal contour) when seen in the plane view, a circle forming the inner shape is smaller than a circle forming the outer shape, and the p-side pad electrode pED is included in the circle forming the inner shape when seen in the plane view. In addition, the p-side pad electrode pED is not overlapped with the second transparent electrode TE2 when seen in the plane view, and the p-side pad electrode pED is arranged in a closed region surrounded by the second transparent electrode TE2. Note that the "annular shape" generally means a circle. However, the annular shape is not limited to the circle.

Figure 7B:
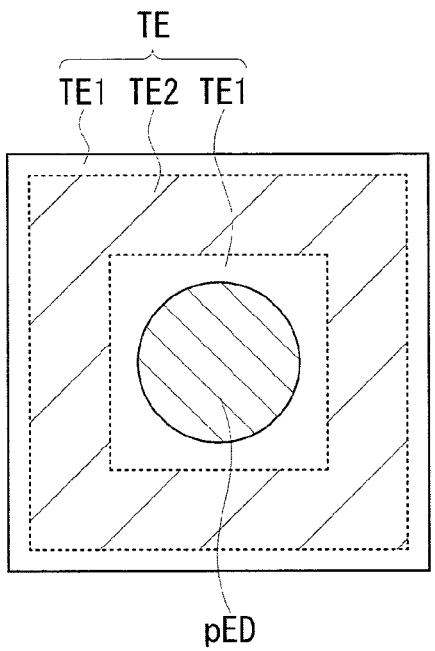
FIG. 7B is a plane view of a principal part describing a shape of the second transparent electrode when seen in a plane view.

In addition, as illustrated in FIG. 7B, the shape of the second transparent electrode TE2 when seen in the plane view may be a frame shape having a predetermined width which surrounds continuously the periphery of the p-side pad electrode pED and which has a corner part. For example, the shape of the second transparent electrode TE2 when seen in the plane view can be a frame shape obtained by excluding a second quadrangle which is formed so as to be a reduced first quadrangle and whose center is the same as a center of the first quadrangle from the first quadrangle. The p-side pad electrode pED is arranged inside the second quadrangle when seen in the plane view.

In other words, the second transparent electrode TE2 has a frame shape surrounded by a quadrangle outer shape and a quadrangle inner shape when seen in the plane view, a quadrangle forming the inner shape is smaller than a quadrangle forming the outer shape, and the p-side pad electrode pED is included in the quadrangle forming the inner shape when seen in the plane view. In addition, the p-side pad electrode pED is not overlapped with the second transparent electrode TE2 when seen in the plane view, and the p-side pad electrode pED is arranged in a closed region surrounded by the second transparent electrode TE2.

Figure 7C:
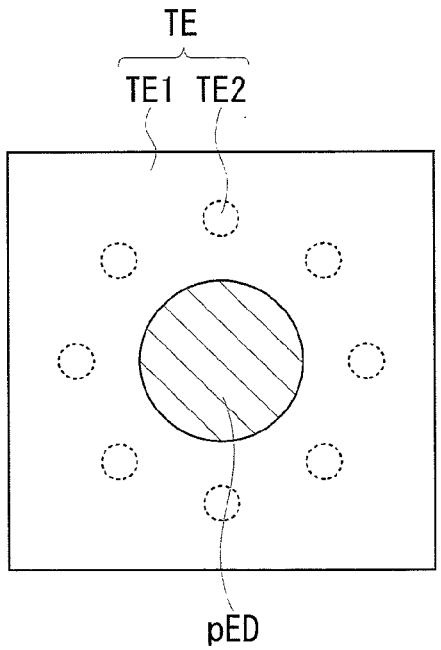
FIG. 7C is a plane view of a principal part describing a shape of the second transparent electrode when seen in a plane view.
Figure 7D:
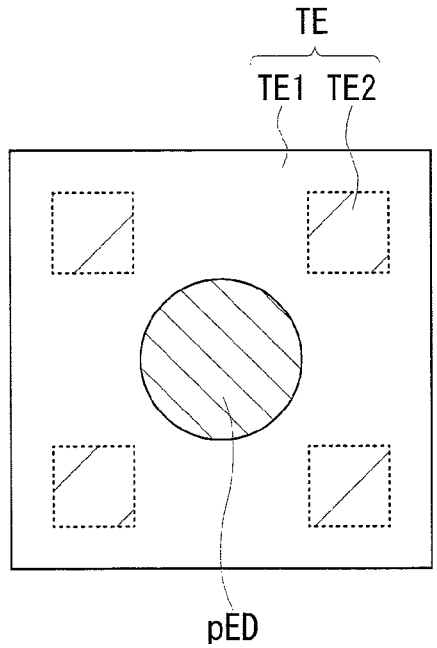
FIG. 7D is a plane view of a principal part describing a shape of the second transparent electrode when seen in a plane view.

In addition, as illustrated in FIG. 7C, the shape of the second transparent electrode TE2 when seen in the plane view may be a shape obtained by regularly or irregularly separating a plurality of circles from each other in the periphery of the p-side pad electrode pED. In addition, as illustrated in FIG. 7D, the shape of the second transparent electrode TE2 when seen in the plane view may be a shape obtained by regularly or irregularly separating a plurality of polygons (quadrangles as a typical shape) from each other in the periphery of the p-side pad electrode pED.

In addition, although a plane shape of the p-side pad electrode pED is formed so as to be the single circle in the first embodiment, the plane shape may be a single circle, a plurality of circles, or a plurality of polygons. In addition, although the p-side pad electrode pED is arranged in the center part of the semiconductor light-emitting element LE1 when seen in a plane view, the p-side pad electrode pED may be formed so as to be close to an end part of the semiconductor light-emitting element LE1 when seen in the plane view in consideration of being embedded in a photo coupler or others.

In addition, although the n-side electrode nED is formed on the whole second surface of the n-type substrate nSUB in the first embodiment, a plane shape of the n-side electrode nED may be formed so as to be a plurality of circles or a plurality of polygons in consideration of a malfunction or others in the division of the n-type substrate nSUB into the chips.

In addition, although the semiconductor light-emitting element LE1 having a configuration having the p-side pad electrode pED for bonding the conductive member formed on the p-type semiconductor side has been exemplified in the first embodiment, this may be a semiconductor light-emitting element having a configuration having an n-side pad electrode for bonding a conductive member formed on an n-type semiconductor side.

As described above, according to the first embodiment, the electric current injected from the p-side pad electrode pED is injected efficiently into the active layer AC in the region except for the region which is overlapped with the p-side pad electrode pED when seen in a plane view. As a result, the light emitted in the junction surface between the p-type clad layer pCL and the active layer AC can be extracted efficiently, and therefore, the high luminous efficiency is acquired.

In addition, the contact resistance between the second transparent electrode TE2 and the p-type contact layer pCN is, for example, a low value of $1 \times 10^{-4}$ $\Omega \cdot cm^2$ or less, and therefore, the element resistance can be decreased.

Therefore, the semiconductor light-emitting element LE1 which is high in the luminous efficiency and low in the element resistance can be achieved.

Modification Example

Figure 8:
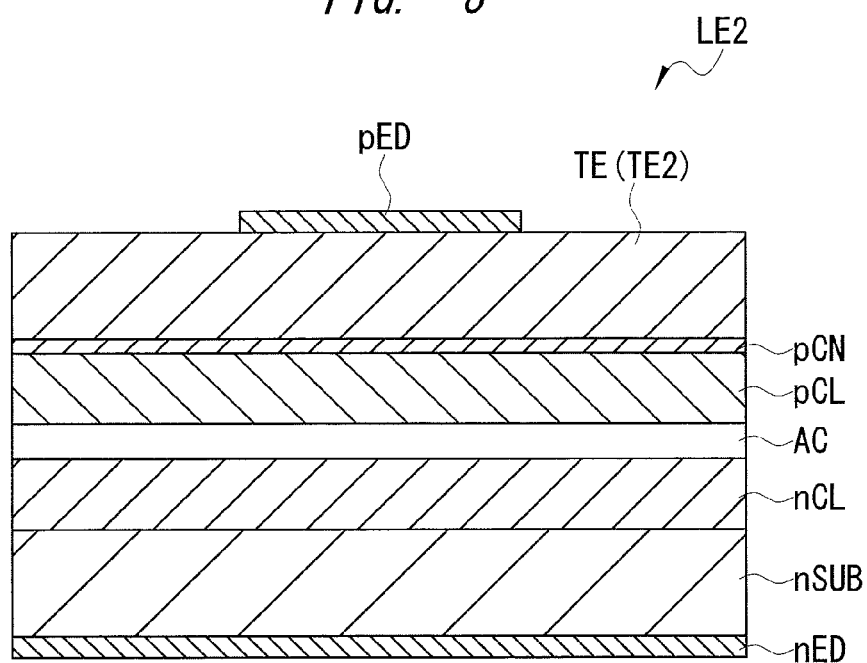
FIG. 8 is a cross-sectional view of a principal part of a semiconductor light-emitting element according to a modification example of the first embodiment.

A semiconductor light-emitting element according to a modification example of the first embodiment will be described by using FIG. 8. FIG. 8 is a cross-sectional view of a principal part of the semiconductor light-emitting element.

In the semiconductor light-emitting element LE1 described above, the transparent electrode TE is formed of the first transparent electrode TE1 and the second transparent electrode TE2. However, in a semiconductor light-emitting element LE2 according to the modification example, all of the transparent electrodes TE are formed of the second transparent electrode TE2 as illustrated in FIG. 8. That is, on the p-type contact layer pCN, only the second transparent electrode TE2 made of the ITO film in which Ti is diffused is formed.

In this manner, a contact resistance between the transparent electrode TE and the p-type contact layer pCN is, for example, a low value of $1 \times 10^{-4}$ $\Omega \cdot cm^2$ or less. Therefore, in the semiconductor light-emitting element LE2, an element resistance can be lower than that of the semiconductor light-emitting element LE1.

However, the electric current injected from the p-side pad electrode pED is diffused in the whole transparent electrode TE and injected into the p-type contact layer pCN. That is, the electric current injected from the p-side pad electrode pED is injected also into the region which is overlapped with the p-side pad electrode pED when seen in a plane view. Therefore, in the semiconductor light-emitting element LE2, the light emitted in the junction surface between the p-type clad layer pCL and the active layer AC cannot be extracted efficiently as compared with the semiconductor light-emitting element LE1, and therefore, the luminous efficiency decreases.

Second Embodiment

Semiconductor Light-Emitting Element

Figure 9:
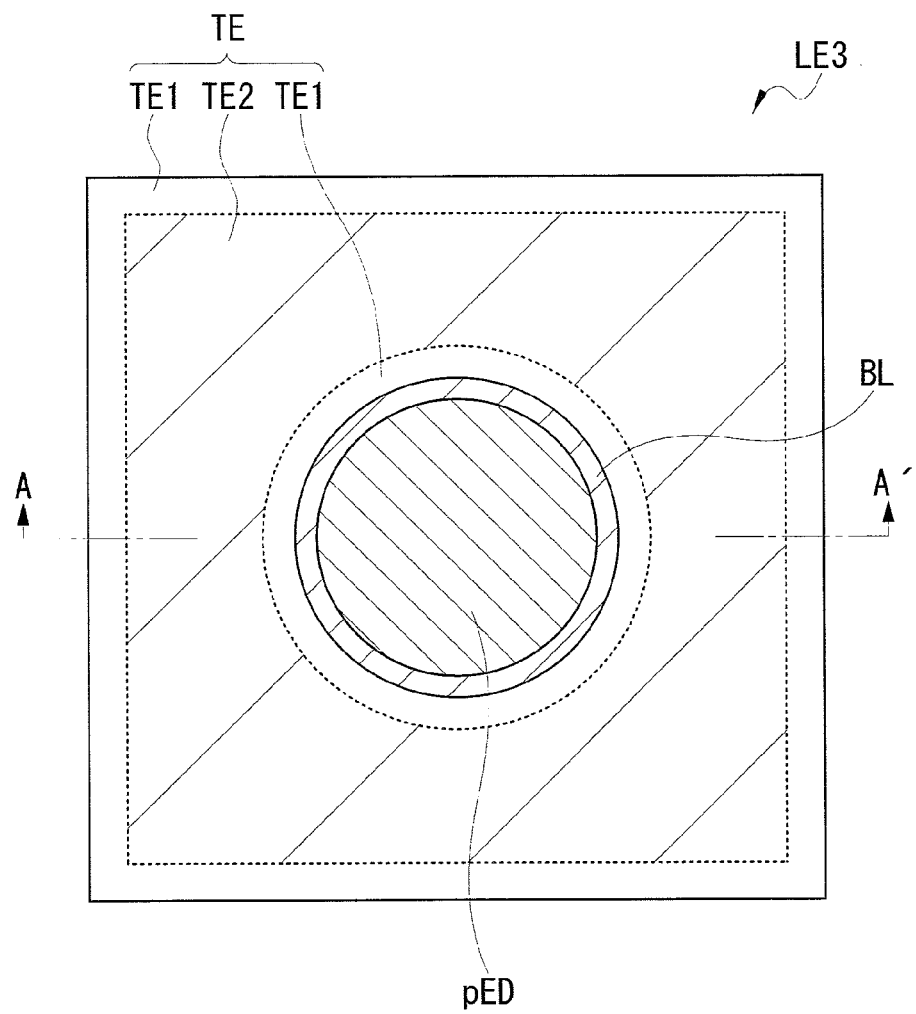
FIG. 9 is a plane view of a principal part of a semiconductor light-emitting element according to a second embodiment.
Figure 10:
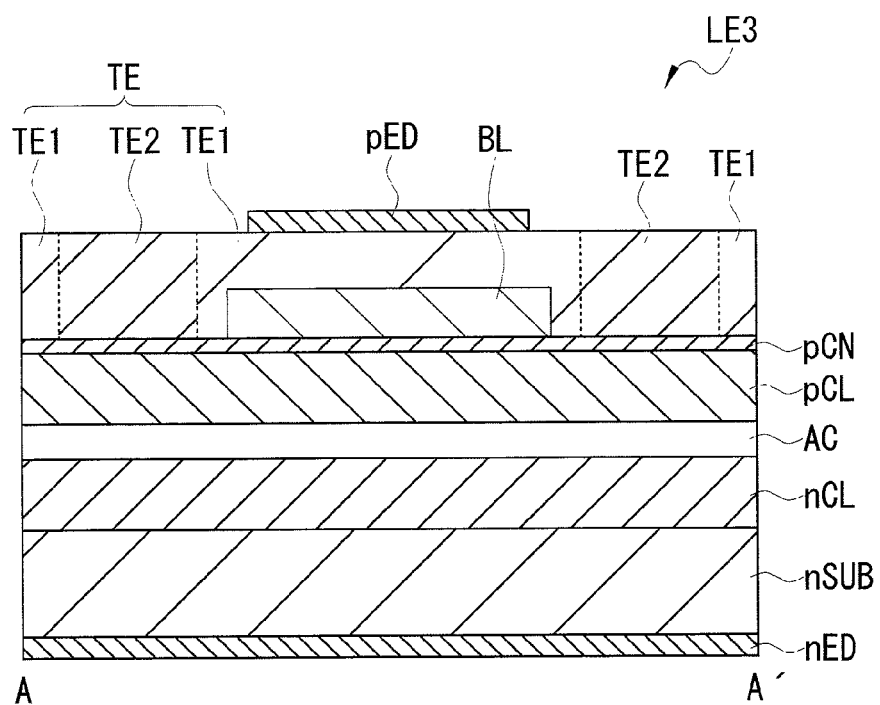
FIG. 10 is a cross-sectional view of a principal part of the semiconductor light-emitting element according to the second embodiment (a cross-sectional view of a principal part of the semiconductor light-emitting element along a line A-A' of FIG. 9).

A structure of a semiconductor light-emitting element according to a second embodiment will be described by using FIGS. 9 and 10. FIG. 9 is a plane view of a principal part of the semiconductor light-emitting element. FIG. 10 is a cross-sectional view of a principal part of the semiconductor light-emitting element (a cross-sectional view of a principal part of the semiconductor light-emitting element along a line A-A' of FIG. 9).

A semiconductor light-emitting element LE3 according to the second embodiment is different from the semiconductor light-emitting element LE1 according to the first embodiment described above in that a block layer BL is formed in a region which is between the p-type contact layer pCN and the first transparent electrode TE1 and which is overlapped with the p-side pad electrode pED when seen in a plane view. Here, a configuration and an effect of the block layer BL provided in the semiconductor light-emitting element LE3 will be described, and descriptions of other configurations or others will be omitted since they are the same as those of the semiconductor light-emitting element LE1 described above.

As illustrated in FIGS. 9 and 10, the block layer BL is formed in a region which is between the p-type contact layer pCN and the first transparent electrode TE1 and which is overlapped with the p-side pad electrode pED when seen in a plane view. A shape of the block layer BL when seen in a plane view (hereinafter, referred to as plane shape thereof) is a single circle, and a dimension (diameter) of a plane shape of the block layer BL is larger than a dimension (diameter) of a plane shape of the p-side pad electrode pED, and does not reach the second transparent electrode TE2 when seen in a plane view. That is, when seen in the plane view, the block layer BL is formed in a region where the first transparent electrode TE1 is formed.

However, the plane shape of the block layer BL is not limited to this, and may be a single polygon, a plurality of circles, or a plurality of polygons in accordance with, for example, the plane shape of the p-side pad electrode pED. In addition, a dimension of the plane shape of the block layer BL may be the same as a dimension of the plane shape of the p-side pad electrode pED, and may be smaller than a dimension of the plane shape of the p-side pad electrode pED.

The block layer BL is an insulation film, and is made of, for example, $SiO_2$ (silicon oxide). A thickness of the block layer BL may be any thickness as long as the transparent electrode TE is not divided and the block layer BL and the p-type contact layer pCN are covered by the thickness, and is desirably, for example, thinner than a thickness of the transparent electrode TE.

The block layer BL is formed by forming an insulation film on the p-type contact layer pCN by the CVD method or the sputtering method, and then, processing this insulation film by the lithography method and the etching method.

In the semiconductor light-emitting element LE1 according to the first embodiment described above, by increasing a contact resistance between the first transparent electrode TE1 and the p-type contact layer pCN so as to be higher than a contact resistance between the second transparent electrode TE2 and the p-type contact layer pCN, the electric current injected from the p-side pad electrode pED is made difficult to flow into the active layer AC in the region which is overlapped with the p-side pad electrode pED when seen in the plane view. However, in the above-described semiconductor light-emitting device LE1, the electric current flows into the active layer AC in the region which is overlapped with the p-side pad electrode pED when seen in the plane view although the current is a small amount.

On the other hand, in the semiconductor light-emitting element LE3 according to the second embodiment, the flow of the electric current into the active layer AC in the region which is overlapped with the p-side pad electrode pED when seen in the plane view can be completely prevented. As a result, in the semiconductor light-emitting element LE3, the light emitted in the junction surface between the p-type clad layer pCL and the active layer AC can be extracted more efficiently than that of the semiconductor light-emitting element LE1, and therefore, the high luminous efficiency is acquired.

In addition, a contact area between the transparent electrode TE and the p-type contact layer pCN is decreased by providing the block layer BL. However, as similar to the semiconductor light-emitting element LE1 according to the first embodiment described above, the contact resistance between the second transparent electrode TE2 and the p-type contact layer pCN is, for example, a low value of $1\times10^{-4}$ $\Omega\cdot cm^2$ or less, and therefore, the element resistance can be decreased.

Note that the second embodiment can also be applied to the semiconductor light-emitting element LE2 according to the modification example of the first embodiment described above. That is, in the semiconductor light-emitting element LE2 illustrated in the above-described FIG. 8, the block layer BL may be formed in a region which is between the p-type contact layer pCN and the transparent electrode TE (second transparent electrode TE2) and which is overlapped with the p-side pad electrode pED when seen in the plane view. In this manner, the flow of the electric current into the active layer AC in the region which is overlapped with the p-side pad electrode pED when seen in the plane view can be completely prevented.

As described above, according to the second embodiment, the semiconductor light-emitting element LE3 which is high in the luminous efficiency and low in the element resistance can be achieved.

In the foregoing, the invention made by the present inventor has been concretely described based on the embodiments. However, it is needless to say that the present invention is not limited to the foregoing embodiments and various modifications and alterations can be made within the scope of the present invention.

For example, in the above-described embodiments, the semiconductor light-emitting element applied to the light source for the photo coupler (light emitting element) has been described. However, the semiconductor light-emitting element according to the embodiments can be applied to, for example, an LED (Light Emitting Diode) backlight, LED lighting, or others.

The present invention includes at least the following embodiments.

[Additional Remark 1]

A semiconductor light-emitting element includes: a substrate which has a first surface and a second surface opposite to the first surface; a semiconductor layer which is formed on the first surface of the substrate; a transparent electrode which is formed on the semiconductor layer and which contains a metal atom; a first electrode which is formed on the transparent electrode and which is electrically connected with apart of the transparent electrode; and a second electrode which is formed on the second surface of the substrate. In the semiconductor light-emitting element, a contact resistance between the transparent electrode and the semiconductor layer is $1\times10^{-4}$ $\Omega\cdot cm^2$ or less.

[Additional Remark 2]

In the semiconductor light-emitting element described in the additional remark 1, a concentration of the metal atom diffused in the transparent electrode is 1 wt % to 10 wt %.

[Additional Remark 3]

In the semiconductor light-emitting element described in the additional remark 1, a concentration of the metal atom diffused in the transparent electrode is 1 wt % to 3 wt %.

[Additional Remark 4]

In the semiconductor light-emitting element described in any one of the additional remarks 1 to 3, the metal atom is Ti, Au or Al.

[Additional Remark 5]

In the semiconductor light-emitting element described in the additional remark 1, a thickness of the transparent electrode is 0.1 μm to 10 μm.

[Additional Remark 6]

In the semiconductor light-emitting element described in the additional remark 1, an insulation film is formed in a region which is between the transparent electrode and the semiconductor layer and which is overlapped with the first electrode when seen in a plane view.

[Additional Remark 7]

In the semiconductor light-emitting element described in the additional remark 1, the semiconductor layer is made of an AlGaAs-based material, an AlGaInAs-based material, an AlGaInP-based material, an AlGaInPAs-based material or an AlGaInN-based material.

What is claimed is:

1. A semiconductor light-emitting element comprising:
    a substrate which has a first surface and a second surface opposite to the first surface;
    a semiconductor layer which is formed on the first surface of the substrate;
    a first transparent electrode which is formed in a first region of the semiconductor layer;
    a second transparent electrode which is formed in a second region except for the first region of the semiconductor layer and which contains a metal atom;
    a first electrode which is in direct contact with the first transparent electrode and which is electrically connected with a part of the first transparent electrode; and
    a second electrode which is formed on the second surface of the substrate,
    wherein a contact resistance between the second transparent electrode and the semiconductor layer is $1\times10^{-4}$ $\Omega\cdot cm^2$ or less, and
    wherein the first transparent electrode does not contain the metal atom.

2. The semiconductor light-emitting element according to claim 1,
    wherein a concentration of the metal atom contained in the second transparent electrode is 1 wt % to 10 wt %.

3. The semiconductor light-emitting element according to claim 1,
    wherein a concentration of the metal atom contained in the second transparent electrode is 1 wt % to 3 wt %.

* * * * *